United States Patent
Butzmann et al.

(10) Patent No.: US 9,997,989 B2
(45) Date of Patent: Jun. 12, 2018

(54) METHOD AND DEVICE FOR ELECTRICAL CURRENT DELIVERY USING PARALLEL SEMICONDUCTOR SWITCHES

(71) Applicant: Robert Bosch GmbH, Stuttgart (DE)

(72) Inventors: Stefan Butzmann, Schalksmühle (DE); Peter Taufer, Renningen (DE); Bernd Eckert, Vaihingen an der Enz (DE)

(73) Assignee: Robert Bosch GmbH, Stuttgart (DE)

(*) Notice: Subject to any disclaimer, the term of this patent is extended or adjusted under 35 U.S.C. 154(b) by 0 days. days.

(21) Appl. No.: 15/529,669

(22) PCT Filed: Sep. 29, 2015

(86) PCT No.: PCT/EP2015/072303
§ 371 (c)(1),
(2) Date: May 25, 2017

(87) PCT Pub. No.: WO2016/082984
PCT Pub. Date: Jun. 2, 2016

(65) Prior Publication Data
US 2017/0331362 A1 Nov. 16, 2017

(30) Foreign Application Priority Data
Nov. 26, 2014 (DE) .......... 10 2014 224 169

(51) Int. Cl.
*H02M 7/538* (2007.01)
*H02M 1/088* (2006.01)
(Continued)

(52) U.S. Cl.
CPC .............. *H02M 1/088* (2013.01); *H02M 1/32* (2013.01); *H02M 7/5387* (2013.01); *H02M 7/53806* (2013.01); *H03K 17/127* (2013.01)

(58) Field of Classification Search
CPC . H02M 7/538; H02M 7/53806; H02M 7/5387
(Continued)

(56) References Cited

U.S. PATENT DOCUMENTS 6,304,460 B1* 10/2001 Cuk .................. H02M 1/34
363/131
6,462,962 B1* 10/2002 Cuk .................. H02M 1/34
363/131
(Continued)

FOREIGN PATENT DOCUMENTS

EP 2 445 110 A1 4/2012
JP 55-136868 A 10/1980
(Continued)

OTHER PUBLICATIONS

International Search Report corresponding to PCT Application No. PCT/EP2015/072303, dated Dec. 11, 2015 (German and English language document) (7 pages).

*Primary Examiner* — Adolf Berhane
*Assistant Examiner* — Nusrat Quddus
(74) *Attorney, Agent, or Firm* — Maginot, Moore & Beck LLP

(57) ABSTRACT

The disclosure relates to a method and a control device for controlling at power semiconductor switches connected in parallel for switching a total current. The semiconductor switches each have a gate terminal. An input terminal for feeding the total current, an output terminal for discharging the total current, and a joint control terminal for receiving a joint control signal that has the state 'disconnect' or 'connect' are provided. The power semiconductor switches are each connected between to the input terminal and the output terminal. At least one ascertainment unit is designed to receive the joint control signal, ascertain individual control signals in accordance with the joint control signal to control the individual power semiconductor switches, and output the (Continued)

individual control signals to the gate terminals of the power semiconductor switches. The individual control signals each have the state 'disconnect' or 'connect' and differ at least temporarily.

11 Claims, 2 Drawing Sheets

(51) Int. Cl.
*H03K 17/12* (2006.01)
*H02M 1/32* (2007.01)
*H02M 7/5387* (2007.01)

(58) Field of Classification Search
USPC .................................................. 363/131–136
See application file for complete search history.

(56) References Cited

U.S. PATENT DOCUMENTS

| | | |
|---|---|---|
| 2013/0155745 A1* | 6/2013 | Tanaka .................. H02M 7/003 363/131 |
| 2013/0176752 A1 | 7/2013 | Schelenz et al. |
| 2013/0300400 A1 | 11/2013 | Zhou |
| 2014/0159630 A1 | 6/2014 | Mühlbauer |

FOREIGN PATENT DOCUMENTS

| | | |
|---|---|---|
| WO | 2006/104430 A1 | 10/2006 |
| WO | 2011/120728 A2 | 10/2011 |

\* cited by examiner

METHOD AND DEVICE FOR ELECTRICAL CURRENT DELIVERY USING PARALLEL SEMICONDUCTOR SWITCHES

This application is a 35 U.S.C. § 371 National Stage Application of PCT/EP2015/072303, filed on Sep. 29, 2015, which claims the benefit of priority to Serial No. DE 10 2014 224 169.3, filed on Nov. 26, 2014 in Germany, the disclosures of which are incorporated herein by reference in their entirety.

The disclosure relates to a method and a control device for controlling power semiconductor switches connected in parallel. Furthermore, the disclosure relates to an electrical system comprising the control device, a computer program for carrying out said method, and an electronic storage medium.

BACKGROUND

Inverters are usually used for operating electrical drives, said inverters converting the electrical energy from a DC voltage source, e.g. a battery, into an AC voltage, in order to supply an electrical machine, e.g. an asynchronous machine, with AC voltage or AC current. The inverter has so-called half-bridges for this purpose. Said half-bridges have power semiconductor switches, by means of which the DC current and the DC voltage are switched in a clocked fashion, such that an AC voltage and an AC current arise at the output terminals of the inverter. Upper limits of current are predefined for said power semiconductor switches, the power semiconductor switches being damaged irreversibly in the event of said upper limits being exceeded. If higher currents are required, then, for the operation of the electrical drive, said power semiconductor switches in the inverters are therefore connected in parallel. On account of component tolerances, however, the power semiconductor switches are loaded to different extents even during parallel operation, since the power semiconductor switches do not switch on simultaneously and, therefore, one of the power semiconductor switches possibly switches on earlier than another. The power semiconductor switch that switches the most rapidly and most sensitively thus bears a greater portion of the switch-on, switch-off and current-conducting losses. Consequently, the current flow between the switches is divided unequally among the power semiconductor switches. Individual power semiconductor switches are thermally loaded to a greater extent than others, age more rapidly and thus fail more rapidly. The maximum load current is therefore determined, if appropriate, by the thermal capacity of individual power semiconductor switches and not by the total current-carrying capacity thereof.

Besides the different switching times of the individual power semiconductor switches connected in parallel, the propagation time differences between the control signals should also be taken into account in the control. One method for minimizing the propagation time differences between the control signals in the control of power semiconductor switches connected in parallel is known from WO 2011/120728 A2.

Therefore, there is a need, for the operation of power semiconductor switches connected in parallel, to develop further solutions that enable a uniform loading of power semiconductor switches connected in parallel. This prevents individual power semiconductor switches from being overloaded and failing prematurely. The robustness of the entire system in which the power semiconductor switches connected in parallel are operated also increases as a consequence.

SUMMARY

A method for controlling at least two power semiconductor switches connected in parallel for switching a total current is provided. The at least two power semiconductor switches connected in parallel each have a gate terminal for controlling the respective power semiconductor switch. The method comprises the following steps: providing an input terminal for feeding the total current, an output terminal for conducting away the total current, and a common control terminal for receiving a common control signal. The control signal has the states open or close. The at least two power semiconductor switches connected in parallel are connected to the input terminal on the input side and to the output terminal on the output side. In a further step, at least one ascertaining unit is provided which receives the common control signal on the input side and ascertains at least two individual control signals depending on the common control signal for controlling the at least two power semiconductor switches and, on the output side, outputs the at least two individual control signals ascertained to the respective gate terminals of the at least two power semiconductor switches. The at least two individual control signals each have the states open or close and, according to the disclosure, differ at least at times, in particular while the common control signal has the state close.

The method thus serves for controlling power semiconductor switches connected in parallel for switching a total current, in particular in a clocked fashion. Insulated gate bipolar transistors (IGBTs), field effect transistors such as MOSFETs or further conventional power semiconductor switches can be used as power semiconductor switches. The power semiconductor switches usually have a gate terminal. Depending on the electrical potential at the gate terminal, a power semiconductor switches and it establishes an electrical connection between the input terminal and the output terminal; the power semiconductor switch is then closed and in the state close. Alternatively the power semiconductor switch electrically disconnects the input terminal and the output terminal from one another, the power semiconductor switch is then open and in the state open. Furthermore, an ascertaining unit is provided which, on the input side, receives a common control signal for controlling at least two power semiconductor switches connected in parallel. The common control signal has the states open or close. Accordingly, an electrical connection between the input terminal and the output terminal is intended to be disconnected or established by means of the power semiconductor switches. To that end, the ascertaining unit outputs on the output side at least two individual control signals that cause the at least two power semiconductor switches to be controlled at predefinable, in particular different, points in time. To that end, the individual control signals likewise have the states open or close. These states are implemented by the power semiconductor switches controlled by means of the individual control signals. The at least two individual control signals are ascertained by the ascertaining unit depending on the common control signal in such a way that they differ at least at times. An at least partly individual control and an at least partly individual switching of the individual power semiconductors connected in parallel are thus carried out. The power semiconductors connected in parallel at least partly do not switch at a common point in time in accordance with the common control signal, but rather at different successive points in time. In particular, an individual switching is carried out in time segments during which the common control signal has the state close. This is possible since just one closed power semiconductor switch suffices to create an electrical connection between input terminal and output terminal in accordance with the state close of the common control signal. In order to create an electrical disconnection between the input terminal and the output terminal in accordance with the state open of the common control signal, it is necessary, in particular, for all the power semiconductor switches connected in parallel to be opened.

Consequently, a method is advantageously provided which makes it possible for power semiconductor switches connected in parallel to be switched on deliberately at different points in time. This makes it possible for switch-on, switch-off and current-conducting losses not to be distributed arbitrarily over one or a few of the power semiconductor switches connected in parallel, but rather, by means of mutually independent control, for example by means of alternate control, of the different power semiconductor switches, to be distributed in a targeted manner and, if appropriate, uniformly among the power semiconductor switches connected in parallel. In particular, by means of selection and alternation of the power semiconductors that close or open first, the switch-on and switch-off losses can be distributed in a targeted manner among the individual power semiconductors. By means of varying the temporal duration of the states, in particular of the state close, of the individual control signals, the current-conducting losses can be varied. A method is thus created which enables more uniform distribution of the power among power semiconductor switches connected in parallel during the operation thereof, even if the power semiconductor switches, on account of their component tolerances or their different dimensioning, react to a control signal at different speeds and with different sensitivities. Operation of a parallel circuit comprising power semiconductor switches for example from different batches or wafers or having different structural sizes or powers without singular overloading of a power semiconductor switch, in conjunction with optimum utilization of the performance of all the power semiconductor switches, is thus made possible.

In one configuration of the disclosure, ascertaining the individual control signals is carried out depending on the control signal in such a way that while the control signal has the state close, at least one first of the individual control signals has the state open. Moreover in particular at least one second of the individual control signals has the state close.

That means that depending on the control signal having the state close, not all of the power semiconductor switches are controlled and closed in parallel, rather at least one first of the individual control signals has the state open and for example only one individual control signal has the state close. The total current thus does not flow via all the power semiconductor switches and is thus also not distributed uniformly over all the power semiconductor switches, but rather is passed in a targeted manner via one or a subset of the power semiconductor switches. Advantageously, in this case, too, the switch-on, the switch-off and current-conducting losses occur in a targeted manner at said one or said subset of the power semiconductor switches.

In another configuration of the disclosure, ascertaining the individual control signals is carried out depending on the control signal in such a way that while the control signal has the state open, all the individual control signals have the state open, and while the control signal subsequently has the state close, at least one second individual control signal has the state open. Moreover, in particular at least one first of the individual control signals has the state close.

This means that, in the case of the state open of the common control signal, all the individual control signals likewise have the state open and thus open all the power semiconductor switches connected in parallel. In the case of a renewed state close of the common control signal, in a targeted manner at least one second individual control signal has the state open, such that then at least one second power semiconductor switch remains open and is not loaded. In particular since at least one first of the individual control signals has the state close, the total current is passed at least partly by the at least first power semiconductor switch or some other subset of the power semiconductor switches, from the input terminal to the output terminal.

What is thus advantageously achieved is that the switch-on, switch-off and current-conducting losses are not always borne by the same power semiconductor switch or the same subset of power semiconductor switches, but rather are distributed among different power semiconductor switches of the power semiconductor switches connected in parallel, ideally uniformly among all of the power semiconductor switches connected in parallel.

In another configuration of the disclosure, ascertaining the individual control signals is carried out depending on the control signal in such a way that in the case of successive states close of the control signal, alternately different individual control signals have the states open in an alternating manner. Alternatively in particular that in the case of successive states close of the control signal, alternately different individual control signals have the states close in an alternating manner. In this case, the alternate individual control signals are selected in particular randomly or according to a fixed order.

That means that the individual control signals are ascertained in such a way that always at least one of the individual control signals which did not already have the state open in the case of the directly preceding state close of the common control signal has the state open. In particular, the individual control signals are ascertained in such a way that always at least one of the individual control signals which did not already have the state close in the case of the directly preceding state close of the common control signal has the state close. By predefining an order in the selection of the alternate individual control signals, a particularly uniform loading of the power semiconductor switches is effected.

This advantageously ensures that all the power semiconductor switches of the power semiconductor switches connected in parallel are loaded more uniformly.

In another configuration of the disclosure, the loading of the power semiconductor switches is determined and ascertaining an individual control signal for controlling the power semiconductor switch is carried out depending on the respective loading of the power semiconductor switch to be controlled.

That means that the loading of a respective power semiconductor switch or of a subset of the power semiconductor switches connected in parallel is detected and taken into account in ascertaining an individual control signal. The loading of a power semiconductor switch associated with the individual control signal, or of the subset of the power semiconductor switches connected in parallel, is ascertained by an absolute value or else for example a profile, for example of the temperature of a power semiconductor switch, being ascertained. Likewise, a loading can also be ascertained by means of a detection of the power loss which occurs during switching and during operation of the power semiconductor switches. A loading of the power semiconductor switch can also be ascertained from the quantity of energy transmitted by means of the power semiconductor switch as a product of the current and the voltage over time. Other variables can also be cumulated for ascertaining the loading and be taken into account as a correlating variable with the loading or aging of the power semiconductor switch. Determining an individual control signal can furthermore also be carried out depending on a cumulated loading over the entire operating time of one or of a subset of the power semiconductor switches connected in parallel or an aging of the power semiconductor switches connected in parallel, for example by taking account of the integrated temperature profile over the entire operating time of one or of a subset of the power semiconductor switches connected in parallel.

Consequently, a method is advantageously created which enables as uniform aging as possible of the power semiconductor switches by virtue of the fact that the power semiconductor switches loaded the least are always selected and controlled and used for the current carrying of the total current from the input terminal to the output terminal by means of the correspondingly ascertained individual control signal.

In a further configuration of the disclosure, an individual control signal has the state close if it controls a power semiconductor switch whose loading is lower than a pre-definable loading threshold value.

This means that loading threshold values are predefined for the individual power semiconductor switches, or for a subset of the power semiconductor switches connected in parallel. Ascertaining an individual control signal involves firstly checking whether a predefined loading threshold value of a power semiconductor switch has been exceeded. If the loading of a power semiconductor switch is greater than the loading threshold value, the corresponding individual control signal is ascertained in such a way that it has the state open. If an individual control signal has the state close, it controls a power semiconductor switch whose loading is lower than the loading threshold value. The loading threshold values can be determined from experimental temperature measurements on the power semiconductor switches or else on the basis of suitable temperature/power loss models. By suitably varying the duration of the states open and close of the individual power semiconductor switches and by using the power semiconductor switches uniformly, said power semiconductor switches can be operated in accordance with their power loss limit. Even if only one power semiconductor switch is available, current carrying with reduced performance can be established in operation under emergency conditions.

Advantageously, therefore, excessively highly loaded power semiconductor switches are no longer provided for the current carrying of the total current from the input terminal to the output terminal. Destruction of a power semiconductor switch that can be accompanied by a short circuit and hence by a defect of the entire electrical system is avoided.

In another configuration of the disclosure, a temperature, a power loss, a transmitted quantity of energy or the switching frequency of the power semiconductor switch to be controlled with the individual control signal is taken into account as the loading of a power semiconductor switch.

This means that a loading which is ascertained during the operation of the power semiconductor switches connected in parallel is taken into account. By way of example, this is the temperature of a power semiconductor switch, the detected power loss that occurs during switching and during operation of the power semiconductor switches, the transmitted quantity of energy as a product of the current and the voltage over time, or the switching frequency.

Advantageously, for the method, examples of loadings of a power semiconductor switch are thus provided which make it possible to ascertain or select the individual control signals of the power semiconductor switches with which reliable and operationally safe operation of the power semiconductor switches is made possible.

In another configuration of the disclosure, the functionality of the power semiconductor switches is determined and, if an individual control signal has the state close, it controls a functional power semiconductor switch.

That means that power semiconductor switches identified as defective from among the power semiconductor switches connected in parallel are not used for the current carrying of the total current from the input terminal to the output terminal. Only individual control signals that control functional power semiconductor switches are output with the state close.

Advantageously, operationally safe operation of the electrical system is thus ensured. In particular, a total failure that may be brought about by short circuits possibly forming is avoided.

In another configuration of the disclosure, at least partly parallel-connected power semiconductor modules are used as power semiconductor switches connected in parallel, wherein a power semiconductor module comprises power semiconductor switches connected in parallel.

That means that at least partly parallel-connected power semiconductor modules are used instead of individual, individually drivable power semiconductor switches connected in parallel. In this case, a power semiconductor module corresponds to a parallel circuit comprising a plurality of power semiconductor switches whose input, output and control terminals are respectively combined. Such power semiconductor modules are known in various sizes and power classes and are used for current carrying and interruption of higher electrical powers by means of a control signal.

Advantageously, operation of parallel-connected power semiconductor modules is thus made possible in which the individual power semiconductor modules are likewise loaded more uniformly than when all the power semiconductor modules are controlled by means of a control signal and, on account of their component tolerances or their different dimensioning, react to a control signal at different speeds and with different sensitivities. Consequently, advantages comparable to those afforded for the operation of power semiconductor switches connected in parallel are afforded for the operation of the power semiconductor modules connected in parallel.

Furthermore, a control device for controlling at least two power semiconductor switches connected in parallel for switching a total current is provided. The at least two power semiconductor switches (LHS1 . . . LHSn) connected in parallel each have a gate terminal for controlling the respective power semiconductor switch (LHS1 . . . LHSn). The total current is fed via an input terminal and conducted away via an output terminal. The at least two power semiconductor switches connected in parallel are connected to the input terminal on the input side and to the output terminal on the output side. The control device comprises a common control terminal for receiving a common control signal having the states open or close. The control device furthermore comprises at least one ascertaining unit configured to receive the common control signal and to ascertain at least two individual control signals depending on the common control signal for controlling the at least two power semiconductor switches and, on the output side, to output the at least two individual control signals ascertained to the respective gate terminals of the at least two power semiconductor switches. The at least two individual control signals (SI1 . . . SIn) each have the states open or close and, according to the disclosure, differ at least at times, in particular while the common control signal has the state close.

The ascertaining unit can be embodied here in particular as hardware, for example as a logic module, but also as pure software for controlling corresponding hardware.

The control device thus serves for controlling power semiconductor switches connected in parallel for switching a total current, in particular in a clocked fashion. Furthermore, an ascertaining unit is provided which, on the input side, receives a common control signal for controlling at least two power semiconductor switches connected in parallel. The common control signal has the states open or close, which are intended to be at least partly implemented by the power semiconductor switches. To that end, on the output side, the ascertaining unit outputs at least two individual control signals for controlling the at least two power semiconductor switches at predefinable, in particular different, points in time. To that end, the individual control signals likewise have the states open or close. These states are implemented by the power semiconductor switches controlled by means of the individual control signals. The at least two individual control signals are ascertained by the ascertaining unit depending on the common control signal in such a way that they differ at least at times. An at least partly individual control and an at least partly individual switching of the individual power semiconductors connected in parallel are thus carried out. The power semiconductors connected in parallel at least partly do not switch at a common point in time in accordance with the common control signal, but rather at different successive points in time. In particular, an individual switching is carried out in time segments during which the common control signal has the state close. This is possible since just one closed power semiconductor switch suffices to create an electrical connection between input terminal and output terminal in accordance with the state close of the common control signal. In order to create an electrical disconnection between the input terminal and the output terminal in accordance with the state open of the common control signal, it is necessary, in particular, for all the power semiconductor switches connected in parallel to be opened.

Consequently, a control device is advantageously provided which makes it possible for power semiconductor switches connected in parallel to be switched on deliberately at different points in time. This makes it possible for switch-on, switch-off and current-conducting losses not to be distributed arbitrarily over one or a few of the power semiconductor switches connected in parallel, but rather, by means of mutually independent control, for example by means of alternate control, of the different power semiconductor switches, to be distributed in a targeted manner and, if appropriate, uniformly among the power semiconductor switches connected in parallel. A device is thus created which enables more uniform distribution of the power among power semiconductor switches connected in parallel during the operation thereof, even if the power semiconductor switches, on account of their component tolerances or their different dimensioning, react to a control signal at different speeds and with different sensitivities. Operation of a parallel circuit comprising power semiconductor switches for example from different batches or wafers or having different structural sizes or powers without singular overloading of a power semiconductor switch, in conjunction with optimum utilization of the performance of all the power semiconductor switches, is thus made possible.

Furthermore, an electrical system is provided which comprises an above-described control device and power semiconductor switches connected in parallel for switching a total current within a vehicle.

An electrical system is thus provided which satisfies the requirements within a vehicle and has a high operating safety of power semiconductor switches connected in parallel.

An electrical system is advantageously provided which enables the uniform aging of power semiconductor switches connected in parallel and thus safe operation of the vehicle.

Furthermore, a computer program is provided which is designed to perform all the steps of one of the methods according to the disclosure.

Furthermore, an electronic storage medium is provided, on which the computer program described is stored.

It goes without saying that the features, properties and advantages of the method according to the disclosure correspondingly apply or are applicable to the control device according to the disclosure and/or to the electrical system, and vice versa.

Further features and advantages of embodiments of the disclosure are evident from the following description with reference to the accompanying drawings.

BRIEF DESCRIPTION OF THE DRAWINGS

The disclosure will be explained in greater detail below with reference to some figures; for this purpose, in the figures.

DETAILED DESCRIPTION

Figure 1:
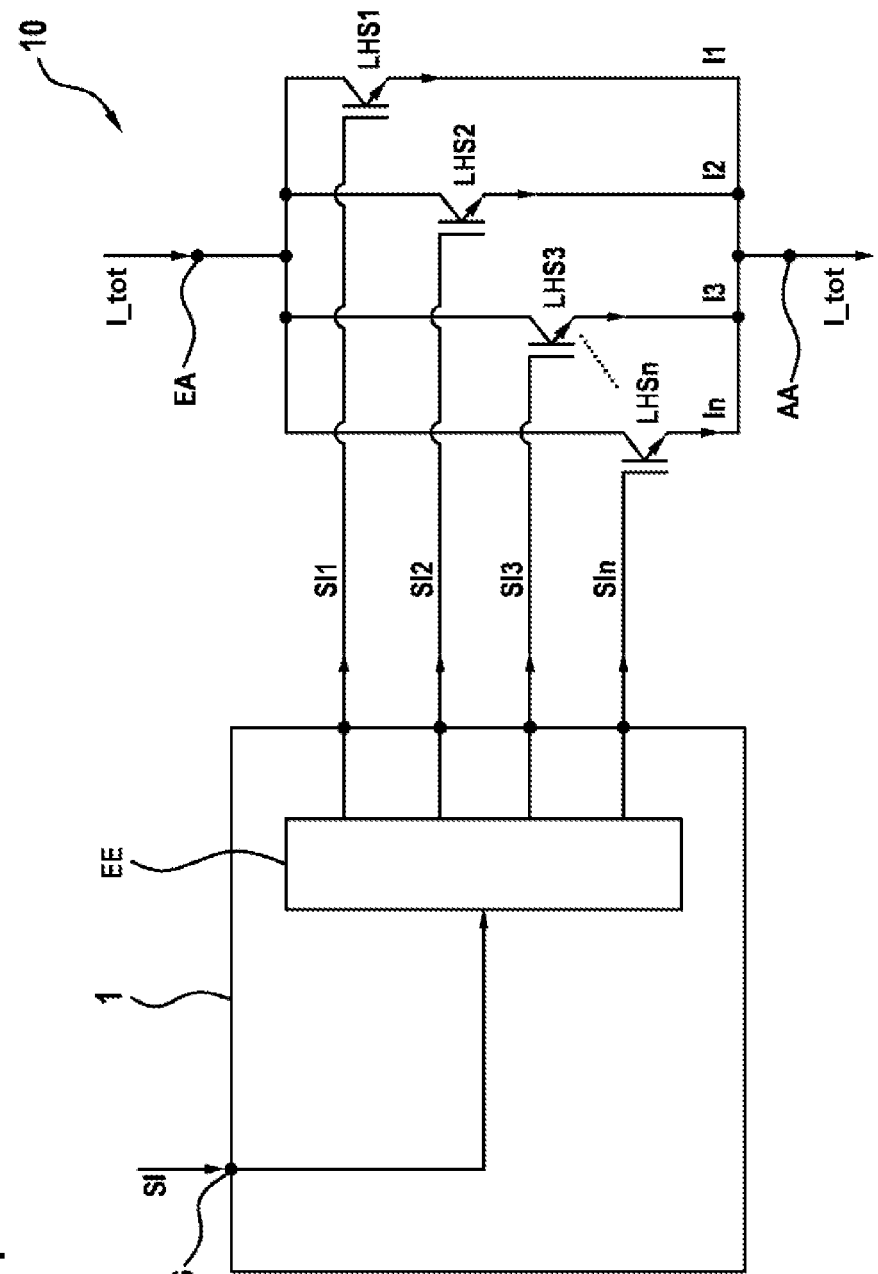
FIG. 1 shows an electrical system comprising a control device in a schematic illustration.

FIG. 1 shows an electrical system 10 in a schematic illustration. A total current I_tot is fed to the electrical system 10 at an input terminal EA. Power semiconductor switches LHS1 . . . LHSn connected in parallel are connected to the input terminal EA on the input side and to the output terminal AA on the output side. The total current I_tot is divided among the power semiconductor switches which are closed, that is to say have the state close. Accordingly, the sum of the individual currents I1 . . . In through the respective power semiconductors LHS1 . . . LHSn connected in parallel always corresponds to the total current I_tot. The total current I_tot is conducted away via the output terminal AA. The power semiconductor switches LHS1 . . . LHSn connected in parallel serve both for current carrying and interruption of the current flow from the input terminal EA to the output terminal AA. The power semiconductor switches LHS1 . . . LHSn connected in parallel each have a gate terminal. The gate terminals among one another are separated from one another, in particular. By way of example, the drawing illustrates that each individual power semiconductor switch has an individual gate terminal. Furthermore, the electrical system 10 comprises a control device 1 having a common control terminal S for receiving a common control signal SI. The control device comprises an ascertaining unit EE, to which the control signal SI is fed. The control signal has the states open or close. The ascertaining unit EE ascertains individual control signals SI1 . . . SIn depending on the control signal SI. The individual control signals (SI1 . . . SIn) each have the states open or close. The individual control signals SI1 . . . SIn are output by the ascertaining unit EE and transmitted to the gate terminals for controlling the power semiconductor switches. This advantageously makes it possible to transmit the common control signal SI over a plurality of mutually independent single individual control signals SI1 . . . SIn. In this regard, for the current carrying of the total current I_tot from the input terminal EA to the output terminal AA, in a targeted manner individual or a subset of the power semiconductor switches LHS1 . . . LHSn connected in parallel can be controlled and used for the current carrying by means of the individual control signals SI1 . . . SIn. The same correspondingly holds true in particular also for the use of power semiconductor modules connected in parallel instead of the power semiconductor switches LHS1 . . . LHSn connected in parallel.

Figure 2:
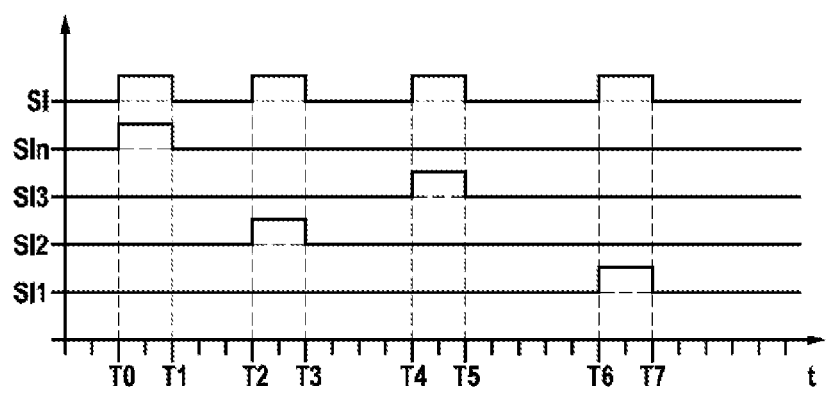
FIG. 2 shows an illustration of the control signals against time.

FIG. 2 shows various control signals plotted against the time axis t. The topmost line reveals the, for example clocked, common control signal SI, which has the state close in each case between the points in time T0 and T1, and also T2 and T3, T4 and T5, and T6 and T7, and otherwise has the state open. Depending on the control signal SI, the ascertaining unit EE ascertains individual control signals SI1 . . . SIn. By means of the electrical system 10, at the points in time at which the control signal SI has the state close, the total current I_tot is intended to be passed from the input terminal to the output terminal. FIG. 2 furthermore illustrates by way of example the individual control signals SI1 . . . SIn for alternating operation of the power semiconductor switches LHS1 . . . LHSn. In this regard, during the first state close of the control signal SI, the individual control signal SIn likewise has the state close. Consequently, the power semiconductor switch LHSn is controlled for transmitting the total current in this period of time. For the second period of time of the state close of the control signal SI, the second power semiconductor switch LHS2 is used, the individual control signal SI2 of which likewise has the state close at this point in time. The states and switching times of the third power semiconductor switch LHS3 and of the first power semiconductor switch LHS1, and also the corresponding individual control signals SI3 and SI1 can be gathered analogously from FIG. 2.

In particular, it is also possible that, for example, the common control signal SI has the state close continuously for a longer period of time, for example between the points in time T0 and T7, and the individual control signals SI1 . . . SIn for alternating operation of the power semiconductor switches LHS1 . . . LHSn within this period of time correspondingly alternately have the state close.

Figure 3:
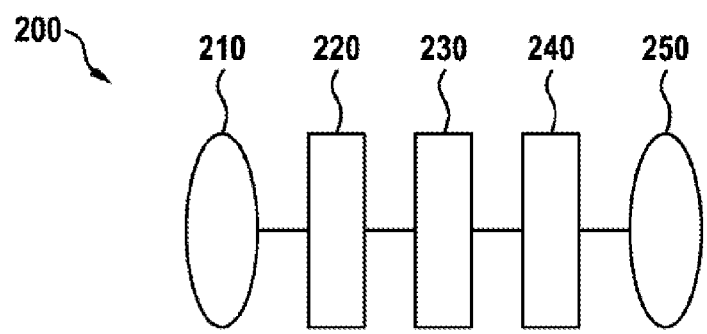
FIG. 3 shows a flow diagram for a method for controlling power semiconductor switches connected in parallel for switching a total current.

FIG. 3 shows a method 200 for controlling power semiconductor switches connected in parallel for switching a total current I_tot. The method starts in step 210. The common control signal SI is received in step 220. In step 230, the individual control signals SI1 . . . SIn are ascertained depending on the control signal SI. In step 240, the individual control signals SI1 . . . SIn are output for controlling the power semiconductor switches. The method ends with step 250.

The invention claimed is:

1. A method for controlling at least two power semiconductor switches connected in parallel for switching a total current, the at least two power semiconductor switches each having a gate terminal configured to control the respective power semiconductor switch, the method comprising:
   providing (i) an input terminal configured to feed the total current, (ii) an output terminal configured to conduct away the total current, and (iii) a common control terminal configured to receive a common control signal, the common control signal having an open state and a close state, the at least two power semiconductor switches each being connected to the input terminal on an input side of the respective power semiconductor switch and to the output terminal on an output side of the respective power semiconductor switch;
   receiving, with an input side of at least one ascertaining unit, the common control signal;
   determining a loading of each of the at least two power semiconductor switches;
   ascertaining, with the at least one ascertaining unit, at least two individual control signals configured to control the at least two power semiconductor switches based on the common control signal, the at least two individual control signals each having the open state and the close state, the at least two individual control signals differing at least at times, wherein the ascertaining of each of the at least two individual control signals is based on the determined loading of the respective power semiconductor switch to be controlled; and
   outputting, with an output side of the at least one ascertaining unit, the at least two individual control signals to the respective gate terminals of the at least two power semiconductor switches.

2. The method as claimed in claim 1, the ascertaining further comprising:
   ascertaining the at least two individual control signals such that, while the common control signal has the close state, at least one first of the at least two individual control signals has the open state.

3. The method as claimed in claim 2, the ascertaining further comprising:
   ascertaining the at least two individual control signals such that, while the common control signal has the open state, all of the at least two individual control signals have the open state and, while the common control signal subsequently has the close state, at least one second of the at least two individual control signal has the open state.

4. The method as claimed in claim 3, the ascertaining further comprising:
   ascertaining the at least two individual control signals such that, in a case of the common control signal having successive close states, alternately different individual control signals of the at least two individual control signals have the open state in an alternating manner.

5. The method as claimed in claim 1, the ascertaining further comprising:
   ascertaining the at least two individual control signals such that an individual control signal of the at least two individual control signals has the close state if the determined loading of the respective power semiconductor switch to be controlled is lower than a predefinable loading threshold value.

6. The method as claimed in claim 1, the determining of the loading further comprising:
determining the loading of each of the at least two power semiconductor switches based on at least one of a temperature of the respective power semiconductor switch, a power loss of the respective power semiconductor switch, a transmitted quantity of energy of the respective power semiconductor switch, and a switching frequency of the respective power semiconductor switch.

7. The method as claimed in claim 1, further comprising:
determining a functionality of each of the at least two power semiconductor switches,
wherein the ascertaining of each of the at least two individual control signals is such that an individual control signal of the at least two individual control signals has the close state if the respective power semiconductor switch to be controlled is determined to be functional.

8. The method as claimed in claim 1, wherein at least partly parallel-connected power semiconductor modules are used as the at least two power semiconductor switches, each power semiconductor module including power semiconductor switches connected in parallel.

9. An electrical system for switching a total current comprising:
an input terminal configured to feed the total current;
an output terminal configured to conduct away the total current;
at least two power semiconductor switches connected in parallel, the at least two power semiconductor switches each having a gate terminal configured to control the respective power semiconductor switch, the at least two power semiconductor switches each being connected to the input terminal on an input side of the respective power semiconductor switch and to the output terminal on an output side of the respective power semiconductor switch;
a common control terminal configured to receive a common control signal, the common control signal having an open state and a close state; and
at least one ascertaining unit configured to:
receive the common control signal at an input side of the at least one ascertaining unit;
determine a functionality of each of the at least two power semiconductor switches;
ascertain at least two individual control signals configured to control the at least two power semiconductor switches based on the common control signal, the at least two individual control signals each having the open state and the close state, the at least two individual control signals differing at least at times, wherein the ascertainment of each of the at least two individual control signals is such that an individual control signal of the at least two individual control signals has the close state if the respective power semiconductor switch to be controlled is determined to be functional; and
output, with an output side of the at least one ascertaining unit, the at least two individual control signals to the respective gate terminals of the at least two power semiconductor switches.

10. The electrical system according to claim 9, wherein the electrical system is within a vehicle.

11. A computer program stored in a non-transitory electronic storage medium for an electrical system having (i) an input terminal configured to feed a total current, (ii) an output terminal configured to conduct away the total current, (iii) at least two power semiconductor switches connected in parallel for switching the total current, the at least two power semiconductor switches each having a gate terminal configured to control the respective power semiconductor switch, the at least two power semiconductor switches each being connected to the input terminal on an input side of the respective power semiconductor switch and to the output terminal on an output side of the respective power semiconductor switch, and (iv) a common control terminal configured to receive a common control signal, the common control signal having an open state and a close state, the computer program being configured to, when executed, cause at least one ascertaining unit to:
receive, with an input side of the at least one ascertaining unit, the common control signal;
determine a loading of each of the at least two power semiconductor switches;
ascertain at least two individual control signals configured to control the at least two power semiconductor switches based on the common control signal, the at least two individual control signals each having the open state and the close state, the at least two individual control signals differing at least at times, wherein the ascertainment of each of the at least two individual control signals is based on the determined loading of the respective power semiconductor switch to be controlled; and
output, with an output side of the at least one ascertaining unit, the at least two individual control signals to the respective gate terminals of the at least two power semiconductor switches.

* * * * *